United States Patent
Tu et al.

(10) Patent No.: US 8,729,699 B2
(45) Date of Patent: May 20, 2014

(54) CONNECTOR STRUCTURES OF INTEGRATED CIRCUITS

(75) Inventors: Shang-Yun Tu, Hsin-Chu (TW); Yao-Chun Chuang, Taipei (TW); Ming Hung Tseng, Toufen Township (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/276,090

(22) Filed: Oct. 18, 2011

(65) Prior Publication Data

US 2013/0093079 A1     Apr. 18, 2013

(51) Int. Cl.
 *H01L 23/48* (2006.01)
(52) U.S. Cl.
 USPC .......................................................... 257/737
(58) Field of Classification Search
 USPC .......................................................... 257/737
 See application file for complete search history.

(56) References Cited

U.S. PATENT DOCUMENTS

| | | | |
|---|---|---|---|
| 7,812,438 B2 * | 10/2010 | Jadhav et al. | 257/698 |
| 8,129,840 B2 | 3/2012 | Jo et al. | |
| 2008/0283998 A1 * | 11/2008 | Choi et al. | 257/692 |
| 2008/0287998 A1 * | 11/2008 | Doubler et al. | 606/269 |
| 2009/0278263 A1 * | 11/2009 | McCarthy et al. | 257/778 |

FOREIGN PATENT DOCUMENTS

| KR | 20100008252 A | 1/2010 |
|---|---|---|
| WO | WO 2010-049087 A2 | 5/2010 |

* cited by examiner

*Primary Examiner* — Matthew Reames
*Assistant Examiner* — Nicholas J Choi
(74) *Attorney, Agent, or Firm* — Slater and Matsil, L.L.P.

(57) ABSTRACT

A die includes a substrate, a metal pad over the substrate, and a passivation layer covering edge portions of the metal pad. A metal pillar is formed over the metal pad. A portion of the metal pillar overlaps a portion of the metal pad. A center of the metal pillar is misaligned with a center of the metal pad.

20 Claims, 6 Drawing Sheets

US 8,729,699 B2

CONNECTOR STRUCTURES OF INTEGRATED CIRCUITS

BACKGROUND

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts. Interconnect structures are increasingly determining the limits of performance and the density of modern integrated circuits.

On top of the interconnect structures, connector structures are formed, which may include bond pads or metal bumps formed and exposed on the surface of the respective chip. Electrical connections are made through the bond pads/metal bumps to connect the chip to a package substrate or another die. The electrical connections may be made through wire bonding or flip-chip bonding.

One type of the connector structures includes an aluminum pad electrically connected to the interconnect structures formed of copper. A passivation layer and a polymer layer are formed, with portions of the passivation layer and the polymer layer covering edge portions of the aluminum pad. An under-bump metallurgy (UBM) is formed to extend into the opening in the passivation layer and the polymer layer. A copper pillar and a solder cap may be formed on the UBM and reflowed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Connector structures in semiconductor dies are presented in accordance with an embodiment. The variations of the embodiment are then discussed. Throughout the various views and illustrative embodiments, like reference numbers are used to designate like elements.

Figure 1:
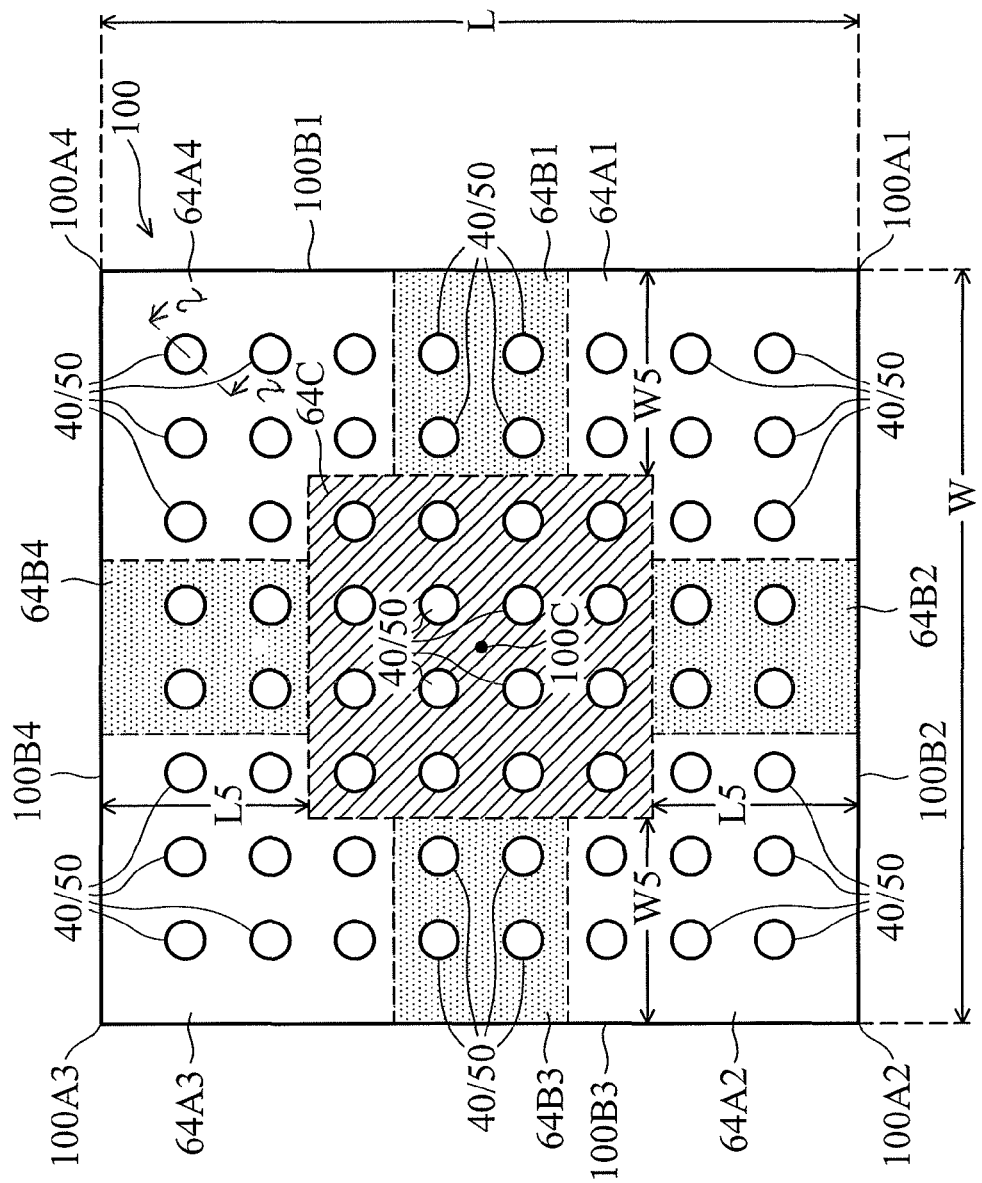
FIG. 1 illustrates a top view of a die, wherein connector structures are distributed in corner regions, edge regions, and an inner region of the die.

FIG. 1 illustrates a top view of die 100 in accordance with various embodiments. Die 100 may be a device die. Die 100 has corners 100A (including corners 100A1 through 100A4) and edges 100B (including edges 100B1 through 100B4). A plurality of electrical connectors 50 may be formed at the surface of die 100. Electrical connectors 50 may be connected to the underlying metal pads 40.

Figure 2:
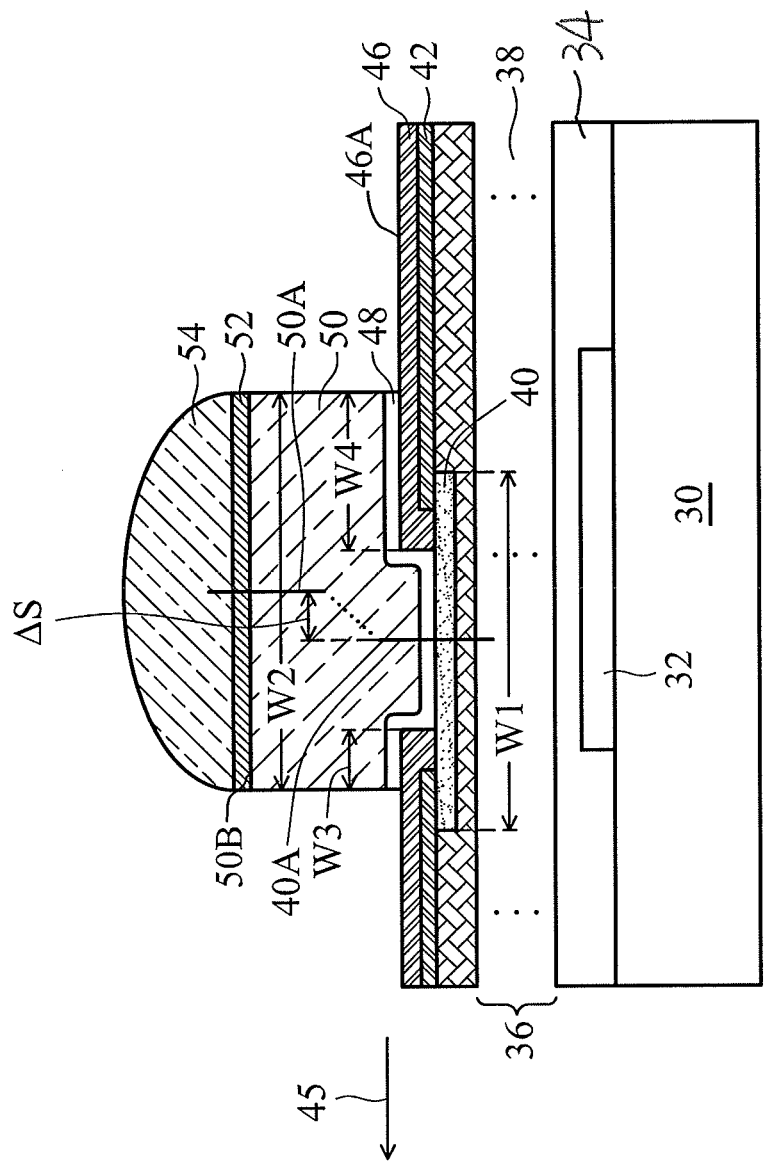
FIG. 2 illustrates a cross-sectional view of a portion of the die shown in FIG. 1.

The details of exemplary electrical connectors 50 and metal pads 40 are shown in FIG. 2, which shows a cross-sectional view of a portion of die 100, wherein the cross-sectional view is obtained from the plane crossing line 2-2 in FIG. 1. Die 100 includes semiconductor substrate 30. In an embodiment, die 100 is a device die, which may include integrated circuits 32 having active devices such as transistors (not shown) therein. Semiconductor substrate 30 may be a bulk silicon substrate or a silicon-on-insulator substrate. Other semiconductor materials including group III, group IV, and group V elements may also be used. In alternative embodiments, die 100 may be the die of other package components that do not include active devices therein, and may be an interposer die, for example. In the embodiments wherein die 100 does not include active devices, die 100 may include passive devices such as resistors and capacitors, or free from passive devices.

Die 100 may further include inter-layer dielectric (ILD) 34 over semiconductor substrate 30, and metal layers 36 over ILD 34. Metal layers 36 may include metal lines and vias (not shown) formed in dielectric layers 38. In an embodiment, dielectric layers 38 are formed of low-k dielectric materials. The dielectric constants (k values) of the low-k dielectric materials may be less than about 2.8, or less than about 2.5, for example. The metal lines and vias may be formed of copper or copper alloys, although they can also be formed of other metals.

Metal pad 40 is formed over metal layers 36, and may be electrically coupled to circuits 32 through the metal lines and vias in metal layers 36. Metal pad 40 may be an aluminum pad or an aluminum-copper pad, and hence is alternatively referred to as aluminum pad 40 hereinafter, although other metallic materials may be used to form metal pad 40. Passivation layer 42 is formed to cover the edge portions of aluminum pad 40. The central portion of aluminum pad 40 is exposed through the opening in passivation layer 42. Passivation layer 42 may be a single layer or a composite layer, and may be formed of a non-porous material. In an embodiment, passivation layer 42 is a composite layer comprising a silicon oxide layer (not shown), and a silicon nitride layer (not shown) over the silicon oxide layer. Passivation layer 42 may also be formed of un-doped silicate glass (USG), silicon oxynitride, and/or the like. Although one passivation layer 42 is shown, there may be more than one passivation layer.

Polymer layer 46 is formed over passivation layer 42. Polymer layer 46 may comprise a polymer such as an epoxy, polyimide, benzocyclobutene (BCB), polybenzoxazole (PBO), and the like. Polymer layer 46 is patterned to form an opening, through which aluminum pad 40 is exposed. The patterning of polymer layer 46 may be performed using photo lithography techniques.

Under-bump metallurgy (UBM) 48 is formed over metal pad 40. UBM 48 comprises a first portion over polymer layer 46, and a second portion extending into the opening in polymer layer 46. In an embodiment, UBM 48 includes a titanium layer and a seed layer, which may be formed of copper or copper alloys. Metal pillar 50 is formed on UBM 48, and is co-terminus with UBM 48. The edges of UBM 48 are aligned to respective edges of metal pillar 50. UBM 48 may be in physical contact with metal pad 40 and metal pillar 50. In an exemplary embodiment, metal pillar 50 is formed of a non-reflowable metal(s) that does not melt in reflow processes. For example, metal pillar 50 may be formed of copper or a copper alloy. The top surface 50B of metal pillar 50 is higher than top surface 46A of polymer layer 46. In addition to metal pillar 50, there may be additional metal layers such as metal layer 52 formed on metal pillar 50, wherein metal layer 52 may include a nickel layer, a palladium layer, a gold layer, or multi-layers thereof. Solder cap 54 may also be formed on metal layer 52, wherein solder cap 54 may be formed of a Sn—Ag alloy, a Sn—Cu alloy, a Sn—Ag—Cu alloy, or the like, and may be lead-free or lead-containing. UBM 48 may also be considered as the bottom part of the metal pillar 50.

In an embodiment, lateral dimension W1 of metal pad 40 is smaller than lateral dimension W2 of metal pillar 50. In alternative embodiments, lateral dimension W1 of metal pad 40 is equal to or greater than lateral dimension W2 of metal pillar 50.

Metal pad 40 as shown in FIG. 2 is misaligned with the respective overlying metal pillar 50. In the top view of the structure in FIG. 2, metal pad 40 has center 40A (also refer to FIGS. 5 and 6), which is shown as line 40A in FIG. 2. Metal pillar 50 also has center 50A in the top view, which is shown as line 50A in FIG. 2. In accordance with embodiments, center 40A is misaligned with center 50A by distance ΔS. In exemplary embodiments, misalignment ΔS may be smaller than about 0.2 percent, or between about 0.01 percent and about 0.09 percent, of length L or width W (FIG. 1), wherein length L and W are the length and the width of die 100. Misalignment ΔS is measured in the same direction length L or width W is measured, depending on the direction of the alignment.

In FIG. 2, arrow 45 is drawn to illustrate the direction of center 100C (also refer to FIG. 1) of die 100. Accordingly, depending on the location of metal pad 40 and metal pillar 50 in die 100, the direction opposite to direction 45 may be toward corners 100A1-100A4 or edges 100B1-100B4 of die 100. As shown in FIG. 2, in the direction toward die center 100C, the overlapping region of metal pillar 50 and polymer layer 46 has width W3, and in the direction away from die center 100C, the overlapping region of metal pillar 50 and polymer layer 46 has width W4, which is greater than width W3. As a result of the misalignment of metal pillar 50 and metal pad 40, metal pillar 50 overlaps more with polymer layer 46 in the direction away from die center 100C than with polymer layer 46 in the direction toward die center 100C. This helps reduce the cracking in dielectric layer 42.

Figure 3:
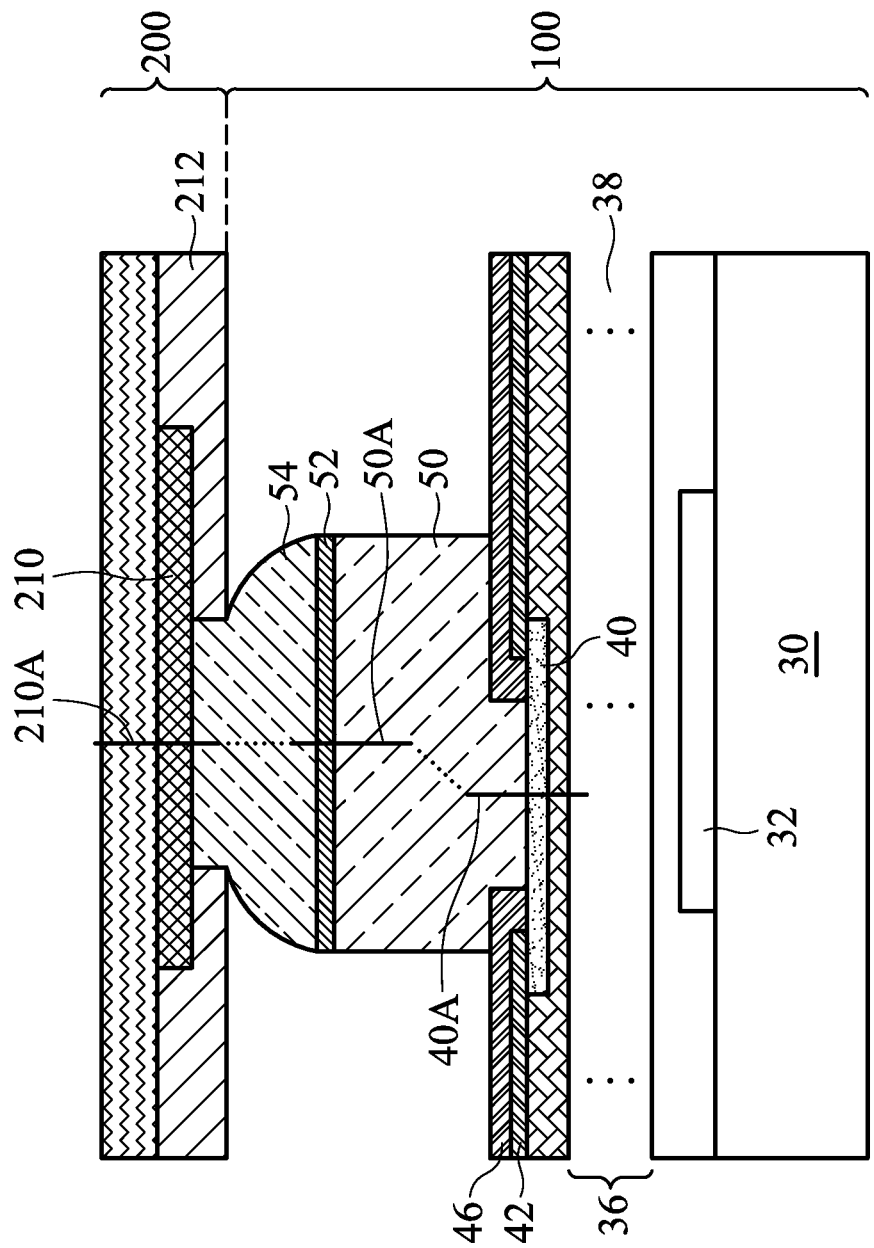
FIGS. 3 and 4 illustrate the bonding of the die in FIG. 1 to another package component.

Referring to FIG. 3, die 100 is bonded to package component 200, which may be a package substrate, a print circuit board (PCB), or an interposer, for example. Accordingly, package component 200 is referred to as package substrate 200, although it may also be another type of package components such as an interposer, a device die, a PCB, or the like. In an embodiment, package substrate 200 includes metal pad 210, and dielectric layer 212 covering portions of metal pad 210. Metal pad 210 may be exposed through an opening in dielectric layer 212, and metal pillar 50 may be bonded to metal pad 210 through the opening. In an embodiment, after the bonding, center 210A of metal pad 210 may be aligned with center 50A of metal pillar 50, and misaligned with center 40A of metal pad 40. Alternatively stating, metal pad 210 may be aligned with metal pillar 50, and misaligned with metal pad 40. It is realized that package substrate 200 may have a first coefficient of thermal expansion (CTE) different from, and possibly greater than, a second CTE of die 100. Accordingly, center 210A of metal pad 210 may need to be misaligned with center 50A of metal pillar 50 before the reflow process, so that when heated in the reflow, due to the difference between the first and the second CTEs, center 210A of metal pad 210 is aligned with center 50A of metal pillar 50. After cooled down from the reflow, center 210A of metal pad 210 may stay aligned with center 50A of metal pillar 50. Accordingly, in the design of metal pad 40, metal pillar 50, metal pad 210, and the respective die 100 and package component 200, the expansion of the materials need to be taken into account.

Figure 4:
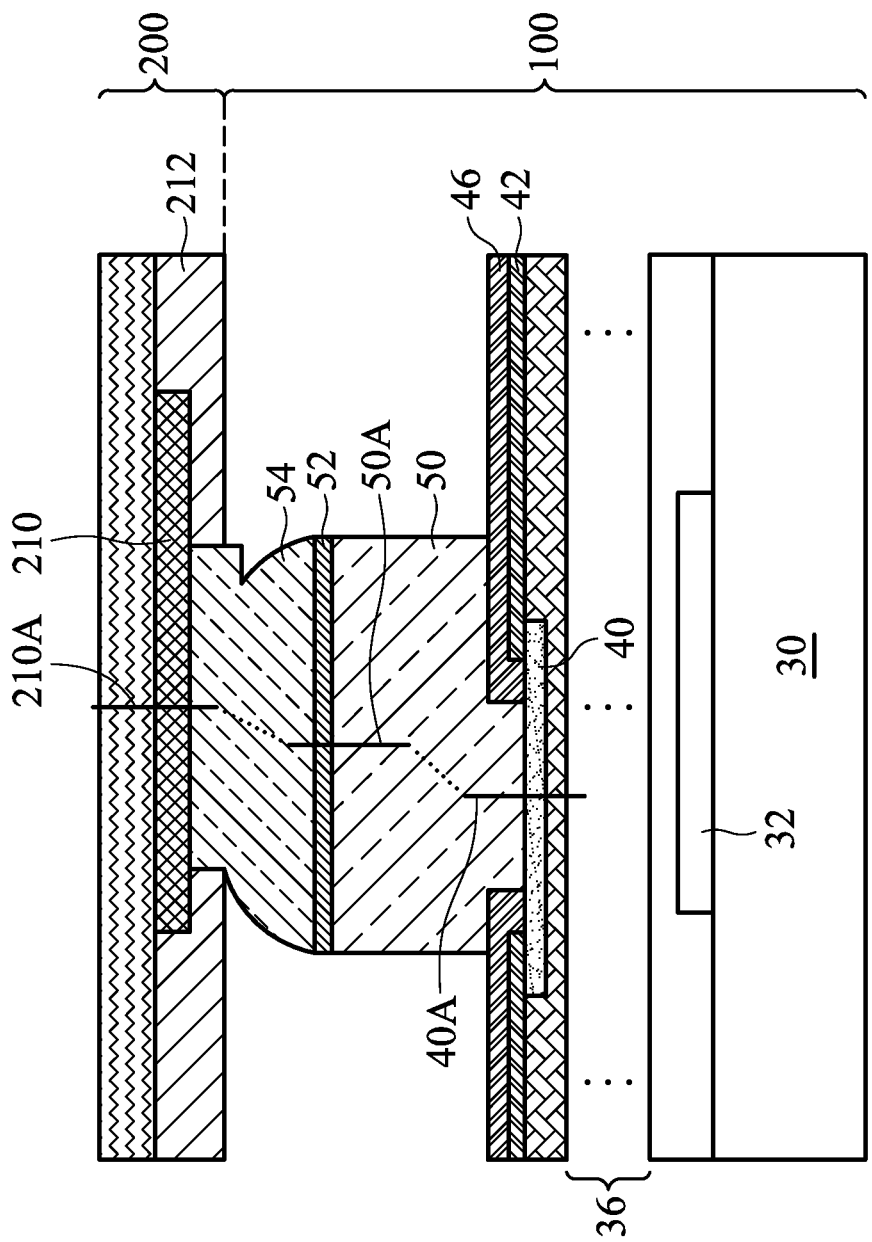

FIG. 4 illustrates a connector structure in accordance with alternative embodiments. In addition to the misalignment between center 40A of metal pad 40 and center 50A of metal pillar 50, center 210A of metal pad 210 is also misaligned with center 50A of metal pillar 50. In the formation of the respective package, center 210A of metal pad 210 may be aligned with center 50A before the reflow. After the reflow, due to the difference between the CTEs of die 100 and package substrate 200, the misalignment between metal pad 210 and metal pillar 50 may occur.

Referring back to FIG. 1, die 100 includes inner region 64C encircled by a peripheral region. The peripheral region may be divided into corner regions 64A (including 64A1 through 64A4), which are adjacent to corners 100A of die 100, and edge regions 64B (including 64B1 through 64B4), which are adjacent edges to 100B of die 100. Length L5 and width W5 of edge regions 64B and corner regions 64A may be smaller than one fourth, or smaller than about 10 percent, of the respective length L and width W of die 100. In each of corner regions 64A, edge regions 64B, and inner region 64C, there may be a plurality of connector structures, each including metal pad 40 and an overlying metal pillar 50, as also shown in FIG. 2.

Figure 5:
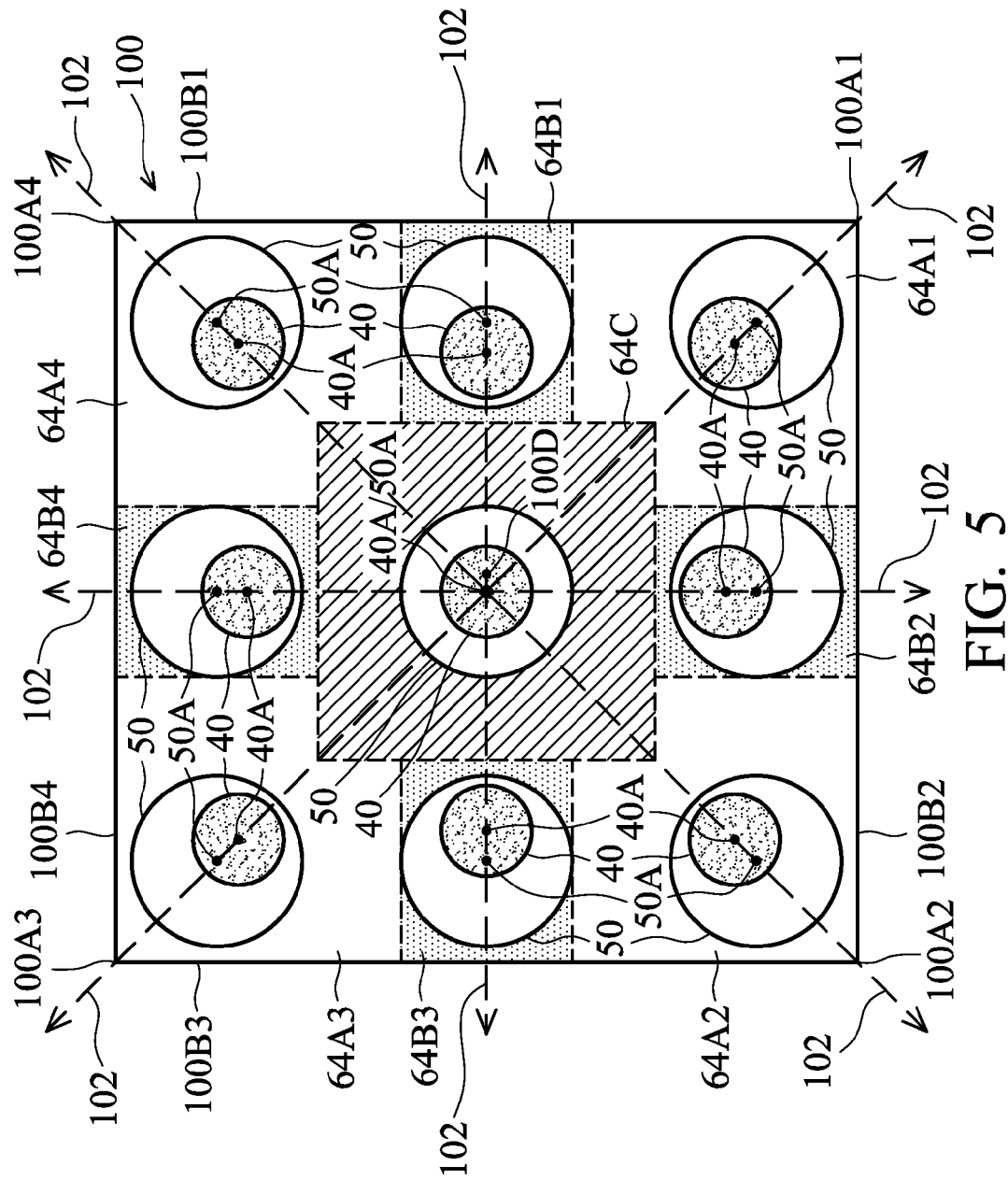
FIG. 5 schematically illustrates the misalignment of metal pillars from respective connecting underlying metal pads in accordance with embodiments, wherein the metal pillars and metal pads have non-elongated shapes.

FIG. 5 schematically illustrates how metal pillars 50 may be misaligned with respective underlying metal pads 40, wherein the misalignment of centers 40A and 50A represent the misalignment of the respective metal pad 40 and metal pillar 50. In each of corner regions 64A, edge regions 64B, and inner region 64C, one metal pad 40 and one metal pillar 50 is illustrated to represent the plurality of metal pads 40 and metal pillars 50 in the same region. As shown in FIG. 5, centers 50A in edge regions 64B are shifted toward the respective edges 100B relative to centers 40A of the respective connecting metal pads 40. For example, centers 50A in edge regions 64B1 are shifted toward edge 100B1, while centers 50A in edge regions 64B3 are shifted toward edge 100B3. The shifting directions (as indicated by dashed arrows 102) are away from center 100C of die 100.

As indicated by the misalignments between centers 40A and 50A, metal pillars 50 in corner regions 64A are shifted toward the respective corners 100A relative to the respective connecting metal pads 40. For example, centers 50A in corner region 64A1 are shifted toward corner 100A1, while metal pillars 50 in corner regions 64A3 are shifted toward corner 100A3. The shifting directions (as illustrated by dashed lines 102) in corner regions 64A are further away from center 100C. For metal pads 50 in corner regions 64A, the shifting directions may be parallel to the lines drawn between center 100C and corners 100A. For metal pads 50 in edge regions 64B, the shifting directions are perpendicular to the extending direction of the respective edges 100B. In each of corner regions 64A, there may be one, two, three, or more corner rows of connector structures having shifted centers 40A/50A, while the rest of metal pads 40 and the respective metal pillars 50 in the corner regions 64 have their centers aligned. In each of edge regions 64B, there may be one, two, three, or more edge rows of connector structures having shifted centers 40A/50A, while the rest of metal pads 40 and the respective metal pillars 50 in the corner regions 64 have their centers aligned. Alternatively, in each of corner regions 64A and edge regions 64B, all connector structures having their metal pads 40 misaligned with the respective metal pillars 50. In inner region 64C, centers 40A of metal pads 40 are aligned with the centers 50A of the respective overlying metal pillars 50. In some embodiments, no connector in inner region 64C has misaligned centers 40A and 50A.

Figure 6:
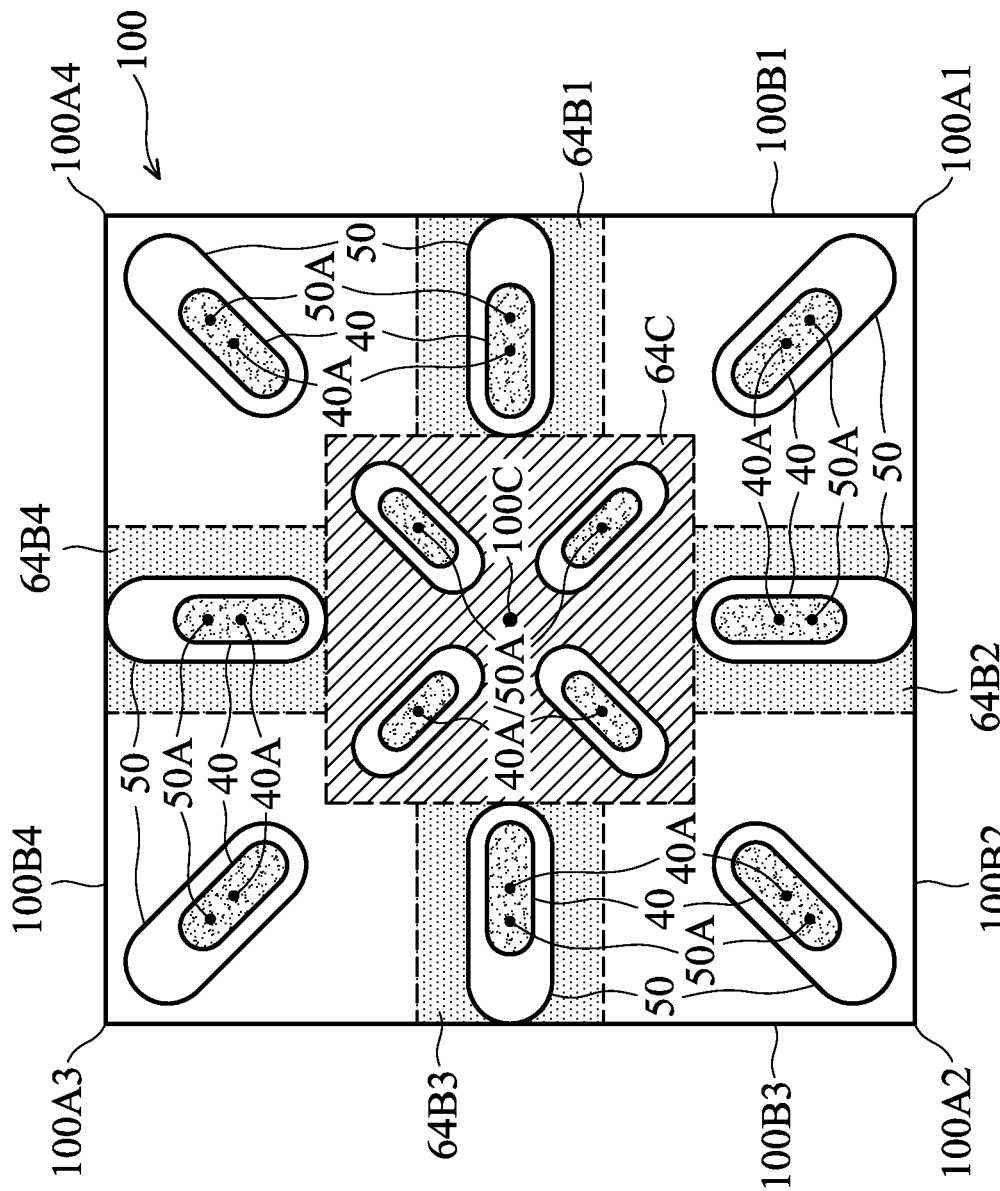
FIG. 6 schematically illustrates the misalignment of metal pillars from respective underlying connecting metal pads in accordance with alternative embodiments, wherein the metal pillars and metal pads have elongated shapes.

In FIG. 5, metal pads 40 and metal pillars 50 are substantially circular symmetrical with no significantly longer and shorter axis (when viewed in the top view). In alternative embodiments, metal pads 40 and metal pillars 50 may have elongated shapes, with a long axis significantly greater than a short axis. FIG. 6 illustrates a top view of an exemplary die 100. This structure is similar to the structure shown in FIG. 5, except the top view shapes of metal pad 40 and metal pillar 50 are stretched in directions, for example, toward center 100C of die 100. This structure may be used for forming bump-on-trace structures. The connector structures in corner regions 64A and edge regions 64B may still include connector structures whose metal pillars 50 are shifted away from center 100C of die 100 relative to the corresponding underlying metal pads 40. On the other hand, in inner region 64C, centers 40A of metal pads 40 and the centers 50A of the overlying metal pillars 50 are still aligned.

In the embodiments, by shifting metal pillars away from the center of the respective die relative to the respective connecting metal pads, the connector structures are more robust, and the likelihood of having passivation cracking is reduced. Experimental results indicated that the passivation cracking, when happened, are more likely to occur on the sides of the metal pads away from the center of the die. On the sides toward the center of the die, the passivation cracking is unlikely to occur. Therefore, by shifting the metal pillars, in the directions away from the center of the die, there is more overlap of metal pillars and polymer layer 46 (FIG. 2). Accordingly, the passivation cracking is reduced.

In accordance with embodiments, a die includes a substrate, a metal pad over the substrate, and a passivation layer covering edge portions of the metal pad. A metal pillar is formed over the metal pad. A portion of the metal pillar overlaps a portion of the metal pad. A center of the metal pillar is misaligned with a center of the metal pad.

In accordance with other embodiments, a die includes a substrate, a first metal pad over the substrate, a passivation layer covering edge portions of the first metal pad, and a first metal pillar over the first metal pad and extending over the passivation layer. The first metal pad and the first metal pillar are in a first corner region of the die. The die further includes a second metal pad over the substrate, and a second metal pillar over the second metal pad. The second metal pad and the second metal pillar are in a second corner region of the die. The first and the second corner regions are on opposite sides of a center of the die. In a top view of the die, centers of the first and the second metal pillars are misaligned with centers of first and the second metal pads, respectively, and are shifted away from the center of the die relative to the centers of first and the second metal pads, respectively.

In accordance with yet other embodiments, a die includes a first, a second, a third, and a fourth corner. The die further includes a substrate, a first, a second, a third, and a fourth metal pad over the substrate, wherein the first, the second, the third, and the fourth metal pads are closer to respective ones of the first, the second, the third, and the fourth corners than any other metal pad in the die. The die further includes a passivation layer covering edge portions of the first, the second, the third, and the fourth metal pads. A first, a second, a third, and a fourth metal pillar are disposed over respective ones of the first, the second, the third, and the fourth metal pads, and extending into openings in the passivation layer to electrically couple to the first, the second, the third, and the fourth metal pads. Centers of the first, the second, the third, and the fourth metal pads are shifted away from centers of the first, the second, the third and the fourth metal pads in directions toward the first, the second, third, and the fourth corners, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a die comprising:
        a substrate;
        a first metal pad over the substrate;
        a passivation layer covering edge portions of the first metal pad;
        an Under-Bump Metallurgy (UBM) comprising a first portion over the passivation layer, and a second portion extending into the passivation layer to connect to the first metal pad; and
        a first metal pillar over the UBM, wherein a portion of the first metal pillar overlaps a portion of the first metal pad, and wherein a center of the first metal pillar is shifted off the center of the first metal pad, wherein an edge of the metal pillar is shifted beyond a respective edge of the metal pad.

2. The device of claim 1, wherein the center of the first metal pillar is shifted away from a center of the die relative to the center of the first metal pad.

3. The device of claim 2, wherein the first metal pad and the first metal pillar are in an edge region of the die, wherein the edge region is adjacent to an edge of the die, and wherein the center of the first metal pillar is shifted in a direction substantially perpendicular to the edge.

4. The device of claim 2, wherein the die comprises a corner region, and the first metal pad and the first metal pillar are in the corner region of the die, wherein the corner region is adjacent to a corner of the die, and wherein the center of the first metal pillar is shifted in a direction substantially parallel to a line drawn between the center of the die and the corner.

5. The device of claim 1 further comprising:
    a second metal pad over the substrate; and
    a second metal pillar over the second metal pad, wherein a portion of the second metal pillar overlaps a portion of the second metal pad, and wherein a center of the second metal pillar is aligned with a center of the second metal pad.

6. The device of claim 5, wherein the second metal pad and the second metal pillar are in an inner region of the die, and are closer to a center of the die than the first metal pad and the first metal pillar.

7. The device of claim 1 further comprising a package component comprising an additional metal pad bonded to the first metal pillar, wherein a center of the additional metal pad is misaligned with the center of the first metal pillar.

8. The device of claim 1 further comprising a package component comprising an additional metal pad bonded to the first metal pillar, wherein a center of the additional metal pad is aligned with the center of the first metal pillar.

9. The device of claim 1, wherein each of the first metal pad and the first metal pillar has a long axis and a short axis shorter than the long axis.

10. The device of claim 1 further comprising an under-bump metallurgy (UBM) between, and contacting, the first metal pad and the first metal pillar.

11. A device comprising:
a die comprising:
a substrate;
a first metal pad over the substrate;
a passivation layer covering edge portions of the first metal pad;
a first Under-Bump Metallurgy (UBM) comprising a first portion over the passivation layer, and a second portion extending into the passivation layer to contact the first metal pad;
a first metal pillar over and contacting the first UBM and extending over the passivation layer, wherein the first metal pad and the first metal pillar are in a first corner region of the die;
a second metal pad over the substrate;
a second UBM comprising a first portion over the passivation layer, and a second portion extending into the passivation layer to contact the second metal pad;
a second metal pillar over and contacting the second UBM, wherein the second metal pad and the second metal pillar are in a second corner region of the die, wherein the first and the second corner regions are on opposite sides of a center of the die, wherein in a top view of the die, centers of the first and the second metal pillars are shifted away from the center of the die relative to the centers of first and the second metal pads, respectively, and wherein an outer edge of the first metal pillar and an outer edge of the second metal pillar are shifted beyond outer edges of first and the second metal pads, respectively; and
a package component bonded to the first and the second metal pillars, wherein the package component is selected from the group consisting essentially of a device die, an interposer, a package substrate, and a printed circuit board.

12. The device of claim 11 further comprising:
a third metal pad over the substrate;
a third metal pillar over the third metal pad, wherein the third metal pad and the third metal pillar are in a first edge region of the die;
a fourth metal pad over the substrate; and
a fourth metal pillar over the fourth metal pad, wherein the fourth metal pad and the fourth metal pillar are in a second edge region of the die, wherein the first and the second edge regions are on opposite sides of the center of the die, and wherein in the top view of the die, centers of the third and the fourth metal pillars are misaligned with centers of the third and the fourth metal pads, respectively.

13. The device of claim 11, wherein a misalignment between a center of the first metal pad and a center of the first metal pillar is between about 0.01 percent and about 0.09 percent of a dimension of the die, with the dimension of the die measured in a direction parallel to a shift direction of the first metal pillar.

14. The device of claim 11 further comprising:
a third metal pad over the substrate; and
a third metal pillar over the third metal pad, wherein a portion of the third metal pillar overlaps a portion of the third metal pad, wherein a center of the third metal pillar is aligned with a center of the third metal pad, and wherein the third metal pad and the third metal pillar are in an inner region of the die, with the center of the die comprised in the inner region.

15. The device of claim 11 further comprising an under-bump metallurgy (UBM) between, and contacting, the first metal pad and the first metal pillar.

16. A device comprising:
a die comprising a first, a second, a third, and a fourth corner, where the die further comprises:
a substrate;
a first, a second, a third, and a fourth metal pad over the substrate, wherein the first, the second, the third, and the fourth metal pads are closer to respective ones of the first, the second, the third, and the fourth corners than any other metal pad in the die;
a passivation layer covering edge portions of the first, the second, the third, and the fourth metal pads;
a first, a second, a third, and a fourth Under-Bump Metallurgy (UBM), each comprising a first portion over the passivation layer, and a second portion extending into the passivation layer, wherein the second portions of the first, the second, the third, and the fourth UBMs are over and in contact with the first, the second, the third, and the fourth metal pads, respectively; and
a first, a second, a third, and a fourth metal pillar over and contacting respective ones of the first, the second, the third, and the fourth metal pads, and extending into openings in the passivation layer to electrically couple to the first, the second, the third, and the fourth metal pads, wherein centers of the first, the second, the third, and the fourth metal pillars are shifted away from centers of the first, the second, the third and the fourth metal pads in directions toward the first, the second, third, and the fourth corners, respectively, and wherein outer edges of the first, the second, the third, and the fourth metal pillars are shifted beyond edges of the first, the second, the third, and the fourth metal pads in directions toward the first, the second, third, and the fourth corners, respectively.

17. The device of claim 16 further comprising:
a fifth, a sixth, a seventh, and an eighth metal pad over the substrate, wherein the fifth, the sixth, the seventh, and the eighth metal pads are in one of edge rows adjacent to a first, a second, a third, and a fourth edge of the die; and
a fifth, a sixth, a seventh, and an eighth metal pillar over respective ones of the fifth, the sixth, the seventh, and the eighth metal pads, wherein centers of the fifth, the sixth, the seventh, and the eighth metal pillars are shifted from centers of the fifth, the sixth, the seventh, and the eighth metal pads toward the first, the second, third, and the fourth edges, respectively.

18. The device of claim 16, wherein a misalignment between a center of the first metal pad and a center of the first metal pillar is between about 0.01 percent and about 0.09 percent of a dimension of the die, with the dimension of the die measured in a direction parallel to a shift direction of the first metal pillar.

19. The device of claim 16 further comprising:
a plurality of metal pads over the substrate; and
a plurality of metal pillars electrically coupled to, and overlapping, the plurality of metal pads, wherein centers of the plurality of metal pillars are aligned with centers of the plurality of metal pads, and wherein the plurality of metal pads and the plurality of metal pillars are in an inner region of the die, with a center of the die comprised in the inner region.

20. The device of claim 16 further comprising an under-bump metallurgy (UBM) between, and contacting, the first metal pad and the first metal pillar.

\* \* \* \* \*